US008077474B2

(12) United States Patent
Perez et al.

(10) Patent No.: US 8,077,474 B2
(45) Date of Patent: Dec. 13, 2011

(54) VARIABLE EQUALIZER APPARATUS

(76) Inventors: Edward Perez, Medley, FL (US); David Wallis, Atlanta, GA (US)

( * ) Notice: Subject to any disclaimer, the term of this patent is extended or adjusted under 35 U.S.C. 154(b) by 320 days.

(21) Appl. No.: 12/213,214

(22) Filed: Jun. 16, 2008

(65) Prior Publication Data
US 2009/0041106 A1 Feb. 12, 2009

Related U.S. Application Data

(60) Provisional application No. 60/929,168, filed on Jun. 15, 2007.

(51) Int. Cl.
*H05K 7/00* (2006.01)
(52) U.S. Cl. ............ 361/760; 361/679.1; 381/1; 381/17; 381/22; 381/27; 381/28; 381/101; 381/106; 381/109; 381/300; 439/623; 330/149; 725/139; 375/228; 375/229; 370/283; 370/407
(58) Field of Classification Search .................. 361/760, 361/679.1; 381/1, 17, 22, 27, 28, 101, 106, 381/109, 300; 439/623; 330/149; 725/139; 375/228, 229; 370/283, 407
See application file for complete search history.

(56) References Cited

U.S. PATENT DOCUMENTS

| 3,710,368 | A | * | 1/1973 | Hamilton | 340/685 |
|---|---|---|---|---|---|
| 4,249,157 | A | * | 2/1981 | Sakamoto | 338/176 |
| 4,414,501 | A | * | 11/1983 | Bedard et al. | 323/280 |
| 4,639,666 | A | * | 1/1987 | Strosser et al. | 324/202 |
| 5,197,099 | A | * | 3/1993 | Hirasawa | 381/27 |
| 5,452,086 | A | * | 9/1995 | Bunn | 356/477 |
| 5,751,816 | A | * | 5/1998 | Howard | 381/300 |
| 5,970,152 | A | * | 10/1999 | Klayman | 381/1 |
| 6,011,852 | A | * | 1/2000 | Howard | 381/28 |
| 6,011,992 | A | * | 1/2000 | Hubbard et al. | 600/547 |
| 6,285,767 | B1 | * | 9/2001 | Klayman | 381/17 |
| 6,503,104 | B1 | * | 1/2003 | Yuga et al. | 439/623 |
| 7,024,059 | B2 | * | 4/2006 | Kurchuk | 385/12 |
| 7,177,143 | B1 | * | 2/2007 | Gomez | 361/679.01 |
| 7,705,543 | B2 | * | 4/2010 | Ragonesi et al. | 315/209 R |
| 2002/0101641 | A1 | * | 8/2002 | Kurchuk | 359/189 |
| 2003/0052728 | A1 | * | 3/2003 | Philpott | 327/385 |

* cited by examiner

*Primary Examiner* — Xiaoliang Chen
(74) *Attorney, Agent, or Firm* — Loeb & Loeb, LLP

(57) ABSTRACT

A variable equalizer apparatus for forward and/or reverse equalizers in an amplifier. The system can include a structure to allow continuous contact of the signal flow as an equalizer is removed; jumpers with fixed resistors and associated capacitors and inductors to produce a variable range over many different values; and/or variable resistance potentiometers with fixed resistors and associated capacitors and inductors to produce a variable range over separate value equalizers.

15 Claims, 10 Drawing Sheets

VARIABLE EQUALIZER APPARATUS

This application claim priority to provisional application No. 60/929,168 filed Jun. 15, 2007.

BACKGROUND OF THE INVENTION

Cable Television networks were originally designed for delivering analog broadcast signals to multiple subscribers. As other signals have been added to the cable system, they have been supported by being transmitted through low noise amplifiers. These amplifiers have progressed in development from 300 MHz to 1 GHz. The analog signals have been joined with digitally compressed video signals, high speed data network signals and digital telephone signals to provide a multiple source of telecommunications to the end user. System architectures have evolved from simple coaxial based transport to advanced architectures that include fiber optic cable and other advanced transmission techniques.

The signals originate at the headend facility and are processed to a broadband output signal. Reception of these signals may include satellites, off-air and direct cable or fiber optic paths. Headend outputs may include analog and digital signals that vary in modulation techniques. The signals are typically distributed to the outside plant cables via fiber optic or coaxial cables. Modern cable television networks are now almost all two way systems and are segmented to allow simultaneous frequency reception in various network sections.

The signals are distributed over a coaxial based network through a network of amplifiers and passive devises. Coaxial cables are constructed with a center conductor surrounded by a dielectric cross section and an outer conductor typically made from an aluminum outer shield. The coaxial cable attenuated the signal in a linear function of its conductor resistance. Different sizes of cable will attenuate the signal flow at different values due to the size of the center conductor and dielectric material.

Booster amplifiers are placed along the coaxial cable. Typically the booster amplifiers are located at points where the signal levels have been reduced to a pre-designed level. These amplifiers must be designed to add a minimum amount of noise and distortion to the processed signals. Amplifiers generate additional noise at various points in their circuitry. This ratio of total input noise power to the thermal noise floor is considered to be the noise figure of a given amplifier. As amplifiers are not perfectly linear they will also contribute additional distortions each time a signal is amplified. Due to the inherent contributions of noise and distortion (e.g., non-linearity), the signal can only be amplified a certain number of times before the change in the signal, as compared to the signal provided at the headend, becomes unacceptable. The cascade effects of the amplifiers (e.g., net distortion introduce into the signal) typically results in a limited number of amplifiers in a continuous cascade. The limiting factors may include the type of modulation, total number of channels and desired performance at the end of the cascade. The Federal Communications Commission has developed specific rules and regulations that govern the acceptable minimum performance to a cable customer. These rules and regulations must be taken into account during the design process of all cable systems.

One of the characteristics of coaxial cable is that the signal loss is less at lower frequencies such as at channel 2 than at higher frequencies at channel 117. Therefore, the amplifier needs less amplification at lower frequencies than at higher frequencies. One way of describing this is that the output of an amplifier is tilted to ensure minimal noise and distortion performance of the downstream signal flow. The cable amplifier output performance is typically reduced for the lower channels in relation to the higher channels based on the total number of channels carried on a cable system. The levels into the first gain block of most amplifies are typically flat, which provides desirable performance. The signal must be equalized at the input of a given amplifier to reduce or equalize these signals. Most legacy and state of the art amplifiers employ fixed cable equalizers. These are commonly plugged into the input or interstage location of the amplifier to reduce the power levels of the lower channel. These equalizers have typically been available in 1 to 1.5 dB increments. A field technician will select the proper values to balance the amplifier to a pre-designed output level, stated in dBmV.

As the characteristics of coaxial cables and amplifier amplification characteristics vary with temperature changes, equalizer values can be changed several times over the course of a yearly time span to reflect the seasonal temperature changes. The signal flow to the cable system and subscriber is interrupted to make these changes. For example, changing the fixed value equalizer circuits commonly results in a 1-2 minute outage.

Cable Television networks based on coaxial distribution have been deployed for the last 30 plus years. The main function of early Cable systems was to provide cable service to areas where off the air reception was unavailable. In the past 20 years most cities and county locations have been wired for cable television services. These services have evolved from 2-12 local off air channels in the 1950 and 1960 to offer services such as High Speed Internet, telephone, and advanced video services such as video on demand. Many cable systems originate their own programming and an increasing number of channels.

A headend facility typically receives and then sends the signals that are carried over the coaxial cable delivery system. The signals at the headend can be received via satellite receive antenna, antenna erected on a tower, microwave links, fiber optic cables and direct coaxial interconnects. These received signals are processed to form a group of channels that are spaced 6 MHz apart. Programming carried over cable delivery systems has increased from the local off air channels to include local, regional, national and international programming. More and more channels have been added over the years so that a typical cable system now might offer 100's of channels with analog and digitally compressed services. Once the signals have been processed at the headend, they can be distributed to the coaxial system via fiber optic cables, microwave transmitters, or directly from the headend over the coaxial network.

The introduction of fiber optic cable has eliminated many of the long coaxial cascades and microwave systems deployed in the 1980's and 1990's. The fiber optic system allows the cable operator to route fiber optic cables closer to a group of customers and supply near headend quality performance at the optical node. The optical node converts the optical light signal to a standard output signal suitable for a coaxial distribution network. The coaxial network delivers the signal to a customer's home where the customer can receive the transmitted signals with a television receiver, set-top converter box, computer system and or telephone receiver. The optical node typically supplies the signal to a group of amplifiers that are capable of amplifying the forward and reverse path signals. A normal format for the signals could be from 54-1000 MHz in the forward path direction and 0-42 MHz in the reverse path direction. Not all coaxial based systems operate at this frequency but most bi-directional systems operate a multi-path concept, and can use different forward and reverse bandwidths.

As mentioned earlier, the optical node can supply the signal to a group of bi-directional amplifiers. These amplifiers are typically powered by a system of power supplies that supplies a voltage between 30 and 90 volts AC. The system power supply is powered from the local utility's power grid. These power supplies may include standby system in the event that the local utility power system fails. The standby system can include battery back up as well as a standby generator backup. The system power supplies require an input voltage of 120-240 volts AC that is stepped down to the 30-90 volts AC required to power the amplifiers. Typically the voltage is converted from a sine wave to a quasi-square wave for better performance and efficiency. The voltage is commonly converted inside of the amplifier from AC voltage to DC voltage to power the internal components of the amplifier.

The output of an amplifier is typically stated in dBmV at the lowest and at the highest frequencies on the cable system. The spacing of amplifiers along a cable route is determined by the loss of the route and is commonly selected based on the recommended operating gain of the amplifier. All amplifiers have a provision for adjusting forward and reverse gain levels. This is commonly accomplished by the installation of a fixed value attenuator that is typically referred to as a "pad." The slope or tilt of the amplifier gain is adjusted by installing a fixed value equalizer. The pads and equalizers might be installed before the input of the first gain hybrid or at the interstage locations that is typically between to gain hybrids.

The majority of current cable television based equalizer components consist of fixed value plug in equalizers that are placed in the forward and reverse signal path to equalize the signals on the cable network. The common electronic configuration is one that intends to compensate for coaxial cable loss of different lengths and types of cable. The forward and reverse signal flow is interrupted when the equalizer is replaced with a different value component. The typical cable television coaxial cable is constructed with a solid aluminum shield with 75 Ohms of impedance to supply a good combination of signal loss, outer diameter and cost. The signals that travel over the cable network must be equalized to supply flat or equal levels to the subscribers in a system. The Federal Communication Commission mandates that all signals provided over a cable system must maintain a peak to valley of less than or equal to less than 10 dBmV for systems of 300 MHz, plus 1 dB for each additional 100 MHz increments or fraction thereof. The overall signal levels for all channels must be maintained below a signal levels that will not overload the input of a television or other signal reception devises. As coaxial cable looses more signal as the frequency is increased, the levels of the lower frequencies must be reduced to provide equal power levels of all signals.

With traditional fixed value equalizers, the cable television technician must re-balance the signal strength several times a year as the resistance of a coaxial cable changes with seasonal temperatures. Each time the equalizer is changed, the cable television signal flow is interrupted while the correct value equalizer is exchanged. The attenuation of a coaxial cable will change approximately 0.1%/degrees/F. The correct value equalizer to balance the system to designed specifications may vary when the temperature changes from 100 degree F. to 0 degrees F. Variable equalizers have been attempted in the past, but with historically very little success due to the overall concept that one equalizer can range the entire 20 dB equalization range.

SUMMARY OF THE INVENTION

One exemplary embodiment of the present invention provides signal conditioning comparable to existing techniques without the addition of a system outage during the balancing process. Exemplary embodiments of the present invention can include both fixed variable resistance equalizer with a selective jumper and a variable potentiometer with an adjustable resistance.

Exemplary embodiments of the present invention can include a make before break motherboard that plugs into the same location as a common equalizer. A motherboard embodying the present invention can allow a technician to adjust the system equalization when either a standard equalizer, fixed variable resistance equalizer with a selective jumper or the variable potentiometer with an adjustable resistance without creating a system outage.

DESCRIPTION OF PREFERRED EMBODIMENTS

Figure 1:
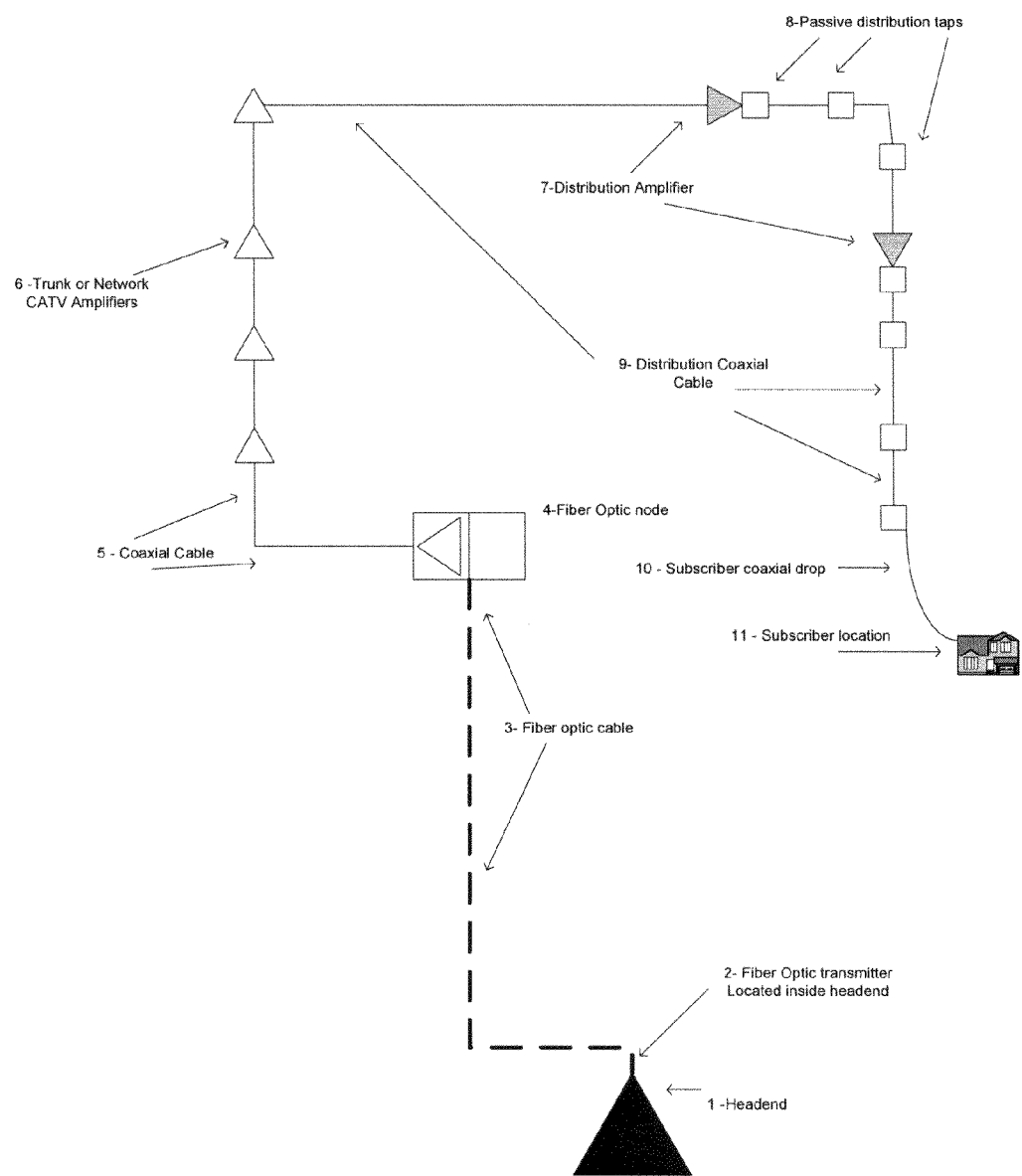
FIG. 1 is a schematic drawing of a typical coaxial cable based CATV system.

FIG. 1 is a schematic drawing of a typical coaxial cable based CATV system. FIG. 1 can represent a typical cable television system that is currently deployed to service cable television subscribers. In the illustrative example shown in FIG. 1, forward signals originate at the headend facility 1 that supplies forward signals to the optical transmitter 2. The optical transmitter transmits the CATV signal to the optical node 4 over the fiber optic cable 3. The optical node 4 also transmits return path signals to the headend optical receiver. A separate optical receiver (not shown) can be located in the headend 1 to receive and process the return path signals form the optical node 4.

The optical node 4 processes the optical signal and can provide a standard RF output signal. The standard RF output signal is then provided to and carried over the coaxial cable 5 to CATV trunk or Network amplifiers 6. Depending upon the network architecture, the Trunk or Network amplifiers 6 can supply the signal to a distribution cable network 9 that feeds signals to the smaller group of amplifiers typically called distribution or Line Extender amplifiers 7.

The distribution amplifiers 7 and distribution cable 9 feed passive devises that are sometimes referred to as distribution or subscriber taps 8. The distribution taps 8 supplies the signal tap for a subscriber's coaxial cable 10 service drop. The subscriber service drop 10 enters the subscriber location 11 and provides the subscriber the desired services, such as television, High Speed Internet devise and/or telephone.

It should be noted that this is just one of many different types of CATV distribution architectures and many Cable TV operators utilize different devices and equipment to deploy their services to the end subscriber. However, in many cases, systems that utilize coaxial cable to distribute their services deploy a similar architecture of fiber optic cable, coaxial cable, amplifiers and passive distribution devises. The signal on the coaxial cable must be equalized as the forward and reverse signals are amplified en-route along the cable. The signals are typically equalized at the input, output and interstage location of each amplifier. The signals can also be equalized at the tap and by deploying in-line equalizers that are spliced in line with the distribution coaxial cable.

Figure 2:
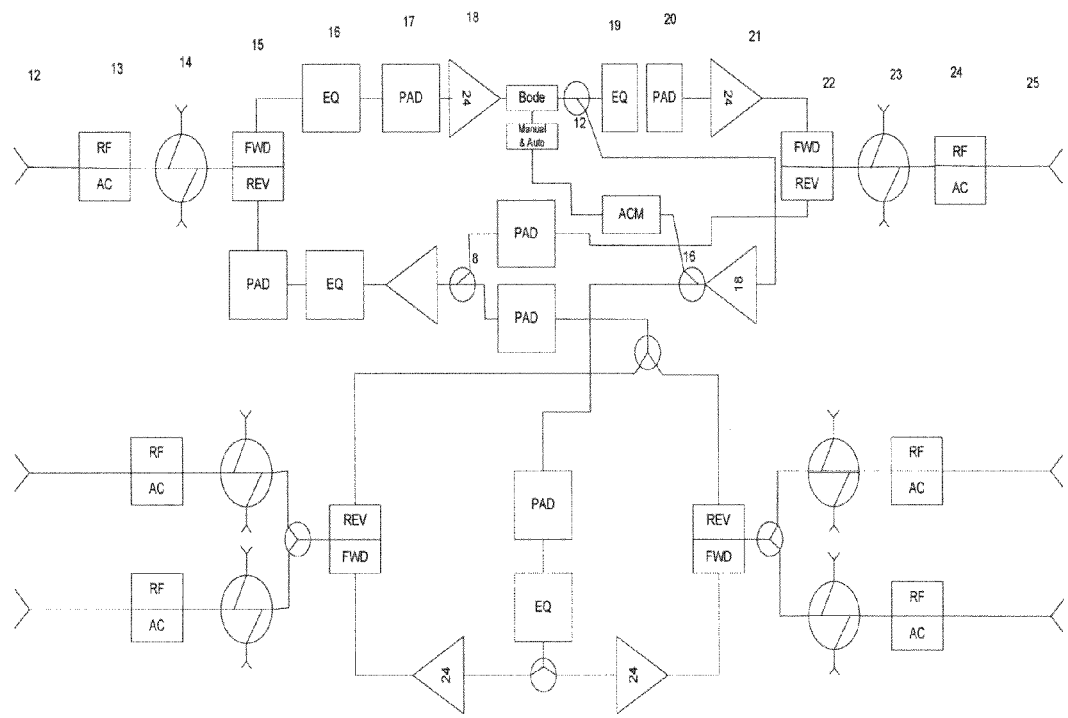
FIG. 2 is a schematic drawing of a typical standard amplifier and application of an equalizer.

FIG. 2 is a schematic drawing of a typical standard amplifier and application of an equalizer. Such amplifiers are typically placed at various locations along the trunk and distribution coaxial cables. These amplifiers have specific purposes and are placed at pre-designed locations to amplify and equalize the forward and reverse signals. As those skilled in the art will readily understand, such amplifiers vary in design and number of output ports to feed different configurations of coaxial cables. Some models feed only one coaxial cable while other may feed many, for example five different output cables.

FIG. 2 illustrates an example amplifier with five different output cables. The forward signal is received via the input coaxial cable 12 and is routed to a RF/AC splitting devise 13. In addition, an AC voltage typically supplies an internal power supply where the AC voltage is converted to a DC voltage to power the amplifier. A bi-directional test point 14 provides the technician a port location to measure the forward input levels or reverse output levels.

In the FIG. 2 example, an RF portion of the signal is routed to a diplex filter 15. The diplex filter 15 separates and/or combines the forward signals of the cable system. A forward portion of the diplexer 15 is connected to the forward path of the amplifier for amplification. The forward signal flow is routed to an input equalizer 16 and an input pad 17. The input equalizer 16 and the input pad 17 conditions the signal to supply a flat input to a first hybrid 18 in the amplifier. The input hybrid 18 amplifies the signal by a pre determined amount. The signal is then processed by another stage of interstage equalization 19 and interstage pad 20.

The interstage equalizer 19 and interstage pad 20 provide a tilted input to the second hybrid 21 in the amplifier. This tilted level maximizes the performance of the amplifier by reducing distortions and increasing the Signal to Noise ratio contributions of each amplifier. The output of the second hybrid 21 is routed to another diplex filter 22 which separates and or combines the forward and reverse path signals for their separate route through the amplifier and cable system. A bi-directional test point 23 provides the technician a port location to measure the forward output levels or reverse input levels. The forward RF signal is then combined with the AC voltage at an AC/RF combiner 24 for signal to flow to the output coaxial cable 25.

Figure 3:
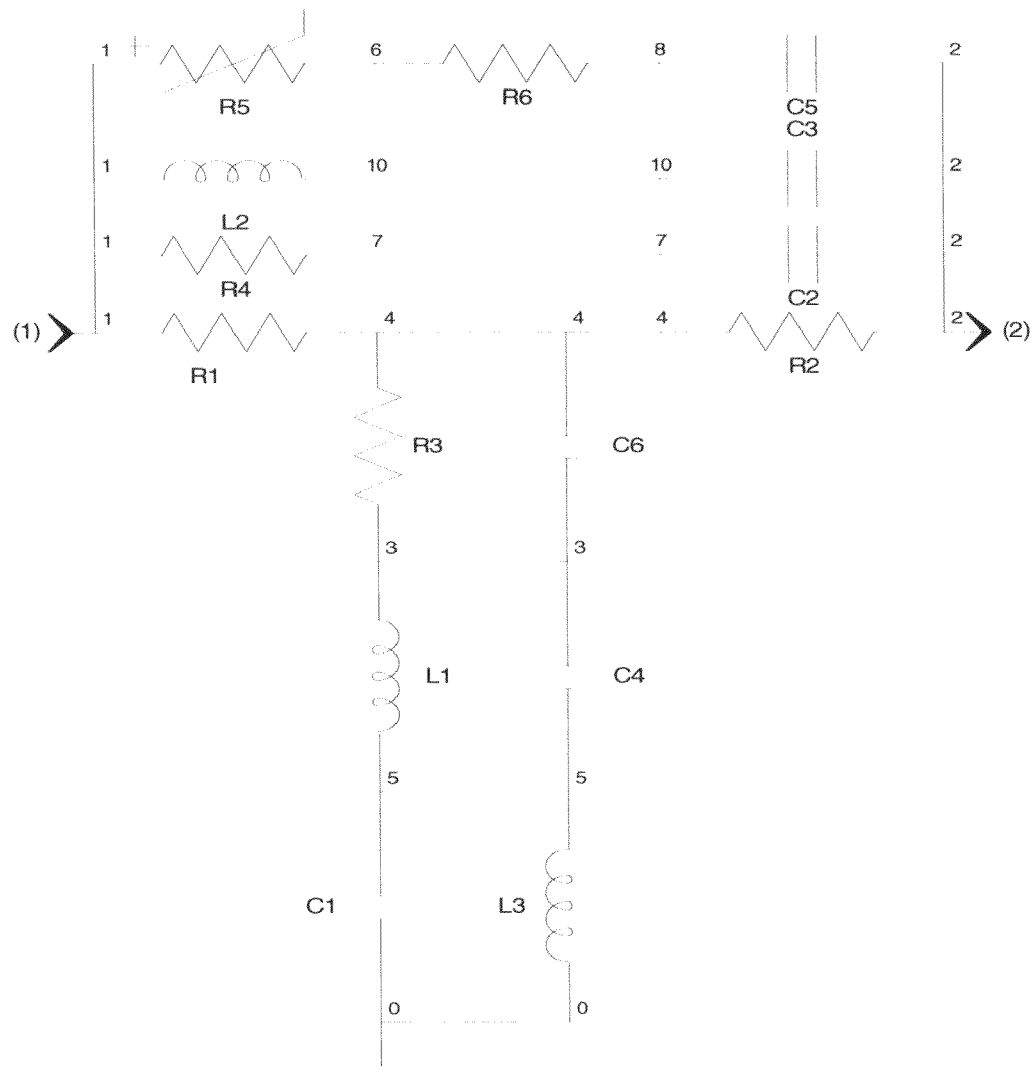
FIG. 3 is a schematic circuit drawing of an equalizer with variable resistance.

FIG. 3 is a schematic circuit drawing of an equalizer with variable resistance. A variable equalizer in accordance with the present invention can be deployed and installed in the existing equalizer locations within an existing amplifier. The FIG. 3 example illustrates a forward cable communications equalizer with matched 75 ohm components. In FIG. 3, R1 represents the input RF location received from the amplifier board equalizer female connection slot. The signal flows through a series of matched resistors, inductors and capacitors R4, L2, R6 C5, C3, and C2 before exiting the equalizer board at R2. In the FIG. 3 example, C1 provides a path to ground for the circuit.

Figure 4:
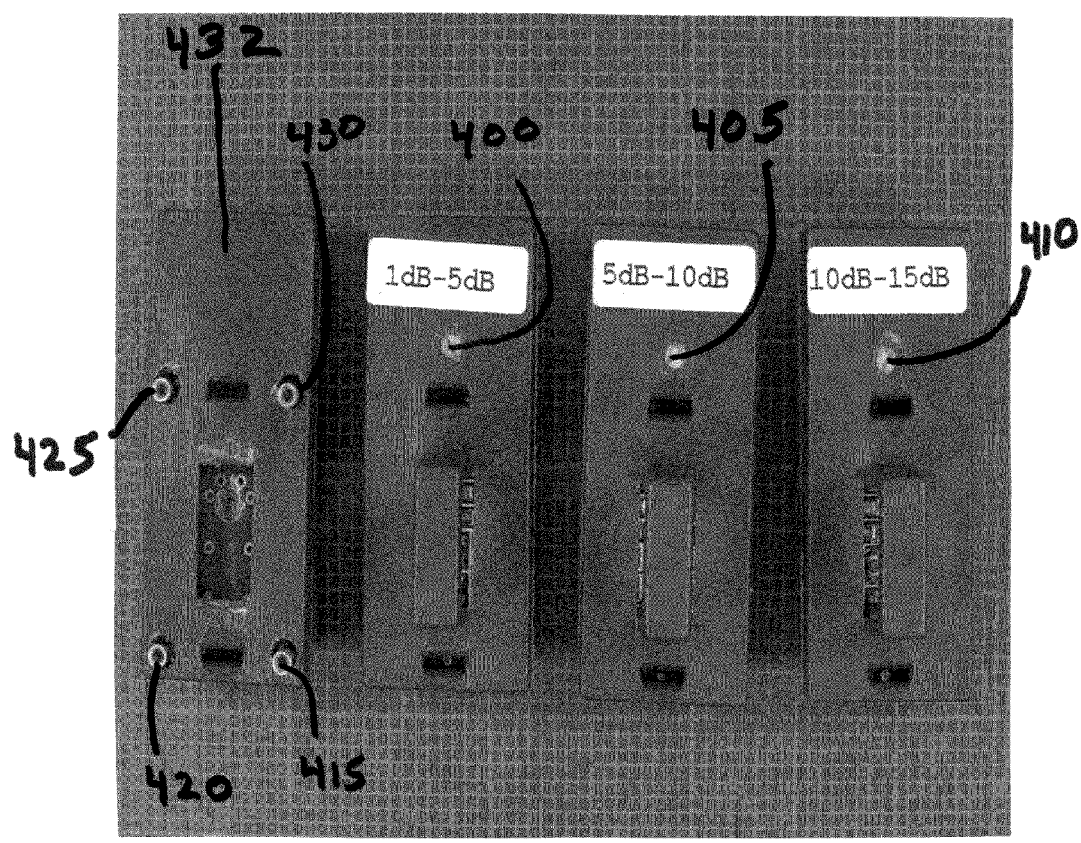
FIG. 4 illustrates an example of a variable potentiometer equalizer.

Referring to FIG. 3, the resistor R-5 identifies a variable resistance circuit component. The variability can be provided by any suitable mechanism. For example the variable resistance can be provided by a variable potentiometer. Typical of such variable potentiometers is that they can be adjusted (e.g., mechanically adjusted via moving a portion of the potentiometer) to achieve different values of resistance. FIG. 4 illustrates an example of a variable potentiometer equalizer. The screw for adjusting the resistance of, for example, R-5 can be seen at the top portion of the right three equalizers, 400, 405 and 410. The top view of the make-before-break plug in is shown on the far left and identified by reference numeral 432. As example, the equalizer can plug into the sockets 415, 420, 425, and 430.

Figure 5:
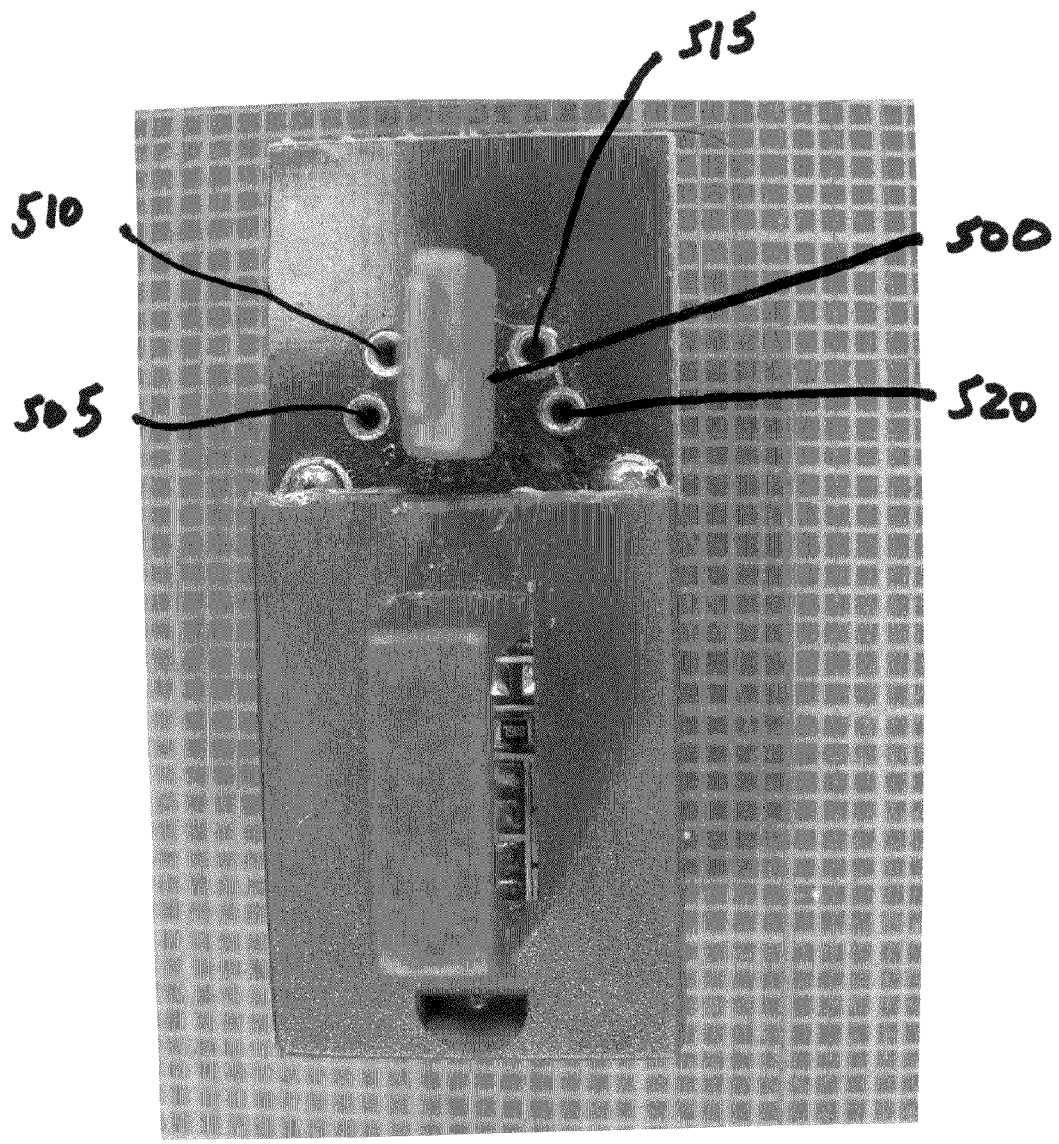
FIG. 5 illustrates an example of a variable jumper equalizer.

In another example, the variability can provided by a series of fixed resistors and a set of jumpers that allow the resistors to be connected so as to vary the resistance of R-5. FIG. 5 illustrates an example of a variable jumper equalizer. In FIG. 5, the jumper 500 can be positioned in any of the positions, such as 505-520, to vary the resistance of R-5. Those skilled in the art will recognize that the jumper can be replaced with any suitable connector, including a switch, e.g., a rotary switch, or a common dipswitch.

Figure 6:
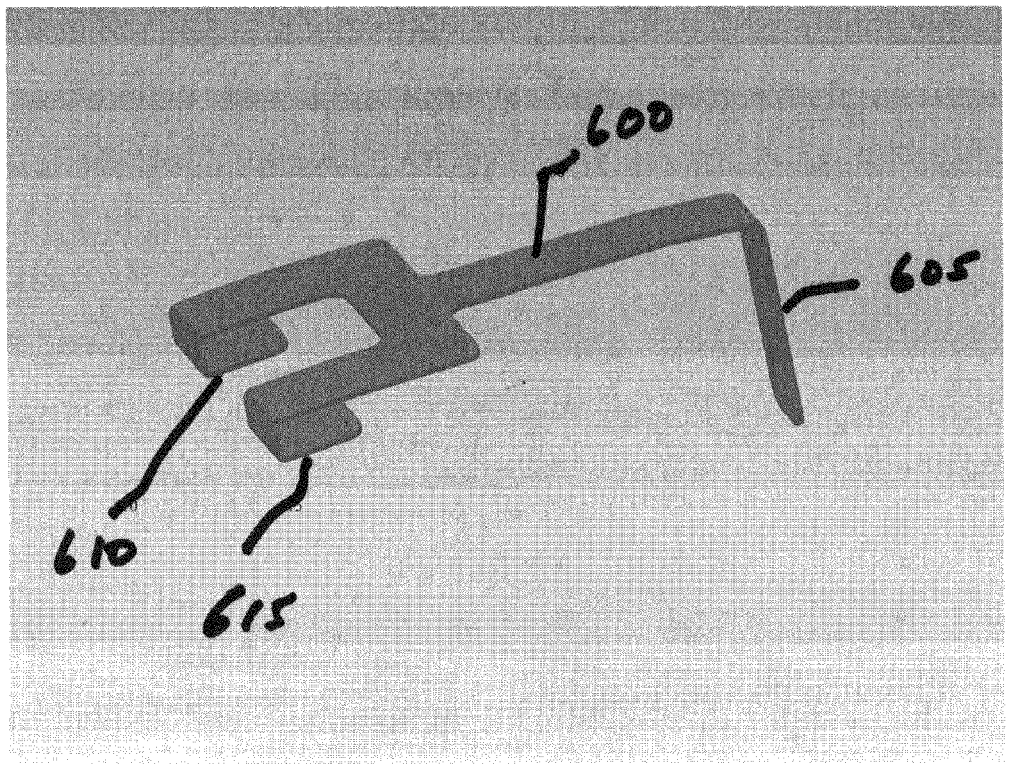
FIG. 6 illustrates an example of a spring contact that can be used to allow make before break connection contacts.

FIG. 6 illustrates an example of a spring contact that can be used to allow make-before-break connection contacts. In the FIG. 6 example, the spring contact 600 includes a probe portion 605. The probe portion 605 extends through the motherboard so that it can contact the bottom of an equalizer board when such equalizer board is inserted into the motherboard. In the FIG. 6 example, the spring contact 600 clip includes a left portion 610 and right portion 615. These portions can wrap around the motherboard and provide mechanical connection to the mother board and solder connection.

Figure 7:
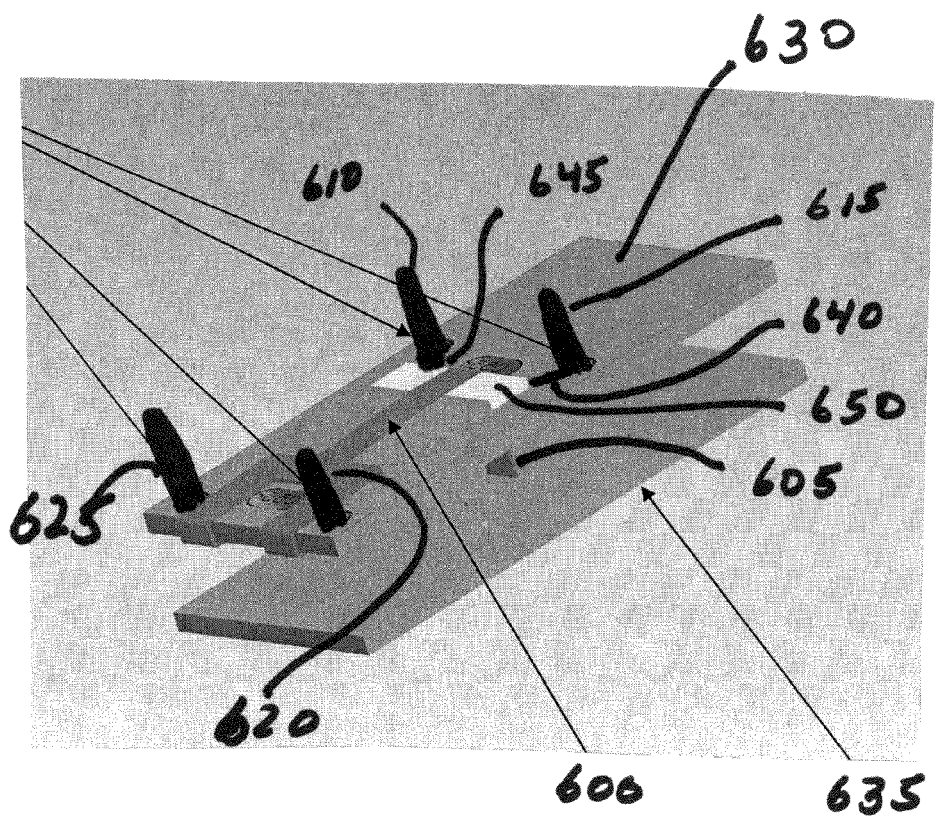
FIG. 7 illustrates an example of a make before break motherboard spring assembly connection.

FIG. 7 illustrates an example of a make-before-break motherboard spring assembly connection utilizing the FIG. 6 spring contact. In FIG. 7, the spring contact 600 is in a position such that contact portion 650 causes pins 610 and 615 to be electrically connected. In this position, the RF signal flows uninterrupted between pins 610 and 165 via trace 640, contact portion 650 and trace 645. When being installed into an amplifier, the pins 610, 615, 620 and 625 of this example structure would be inserted into corresponding locations of the amplifier. Once inserted, the motherboard 630 provides an RF signal path as described above.

Figure 8:
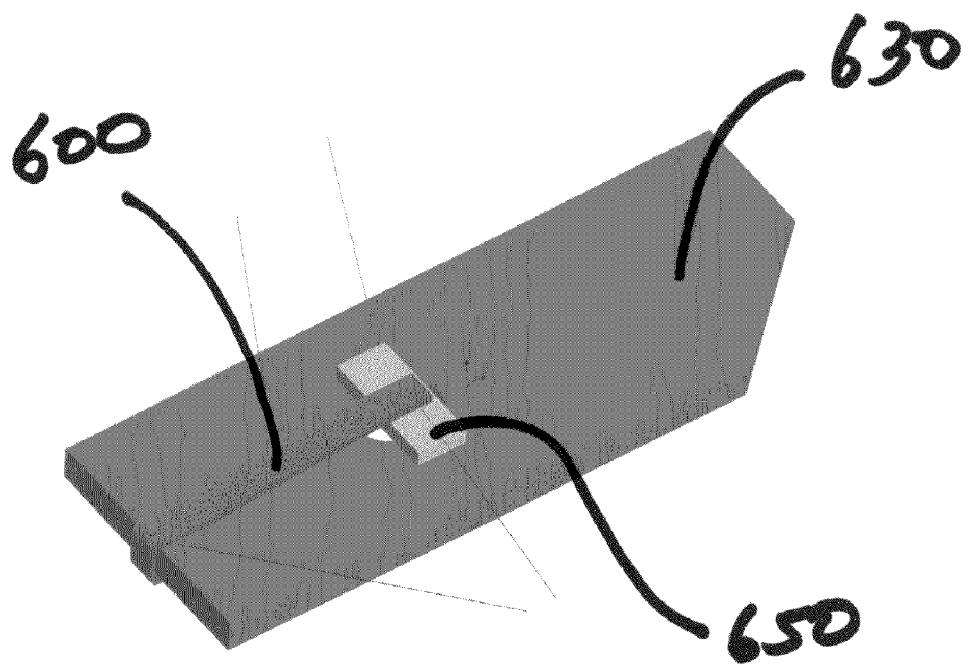
FIG. 8 illustrates another example of a make before break motherboard assembly.

FIG. 8 illustrates another example of a make-before-break motherboard employing an alternate mechanical arrangement of spring contact 600. In the FIG. 8 example, the spring contact 600 has a single wrap around portion for assembly to the motherboard 630. Those skilled in the art will readily understand that spring contact 600 can be attached to the motherboard using any of a wide variety of suitable mechanisms, including, for example, mechanical connections, glue, embedding in the motherboard. The manner in which one end of the spring contact 600 allows it to flex is a matter of design choice as will be easily understood to those skilled in the art. In addition, other mechanisms for providing a movable contact can be used in accordance with the present invention, including other spring loaded switches, such as a micro switch, or a knife switch assembly. Such other suitable movable contact members should provide a movable portion that allows the motherboard to provide the desired make-before-break function when inserting or removing an equalizer into or from the motherboard.

Figure 9:
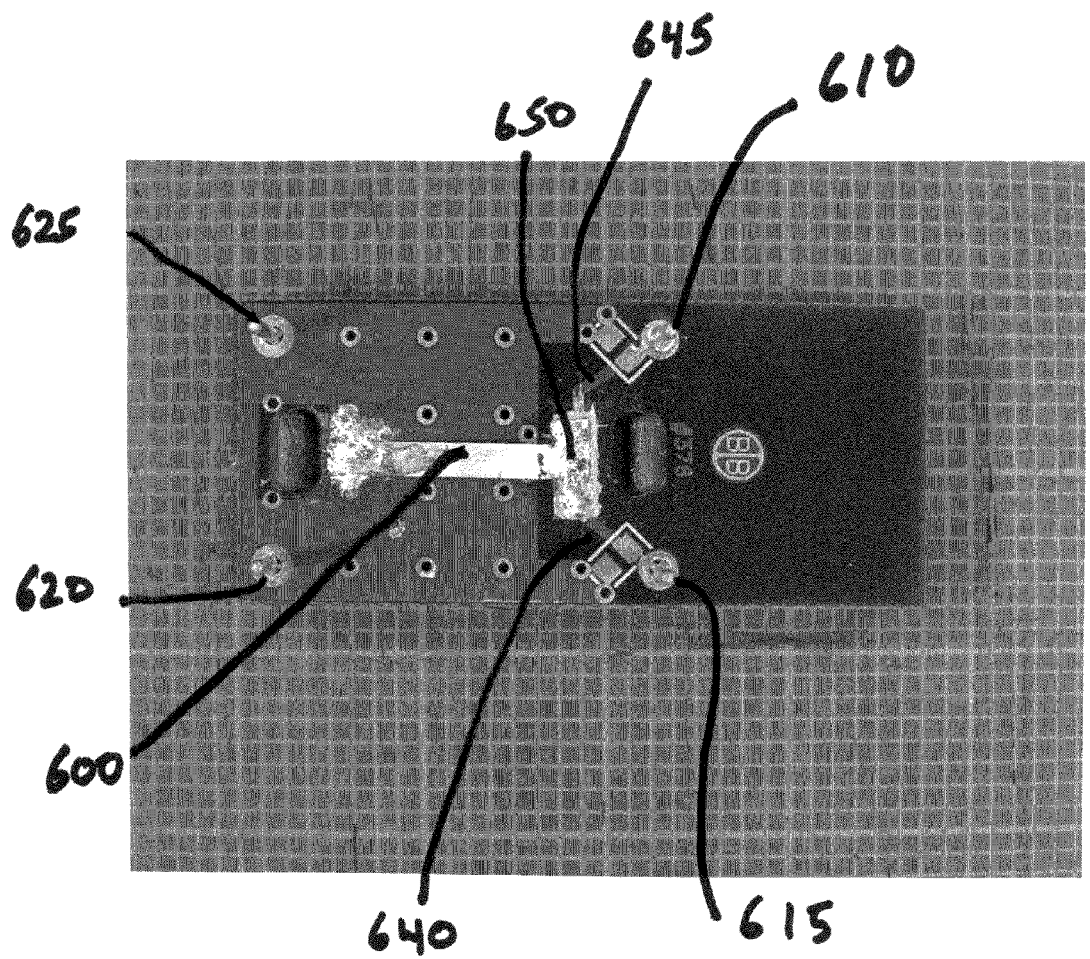
FIG. 9 is a bottom view of an example motherboard similar to that schematically shown in FIG. 7.

FIG. 9 is a bottom view of an example motherboard similar to that schematically shown in FIG. 7. In FIG. 9, the spring contact 600 provides a RF connection between the pins 610 and 615 as described above with respect to FIG. 7.

Figure 10:
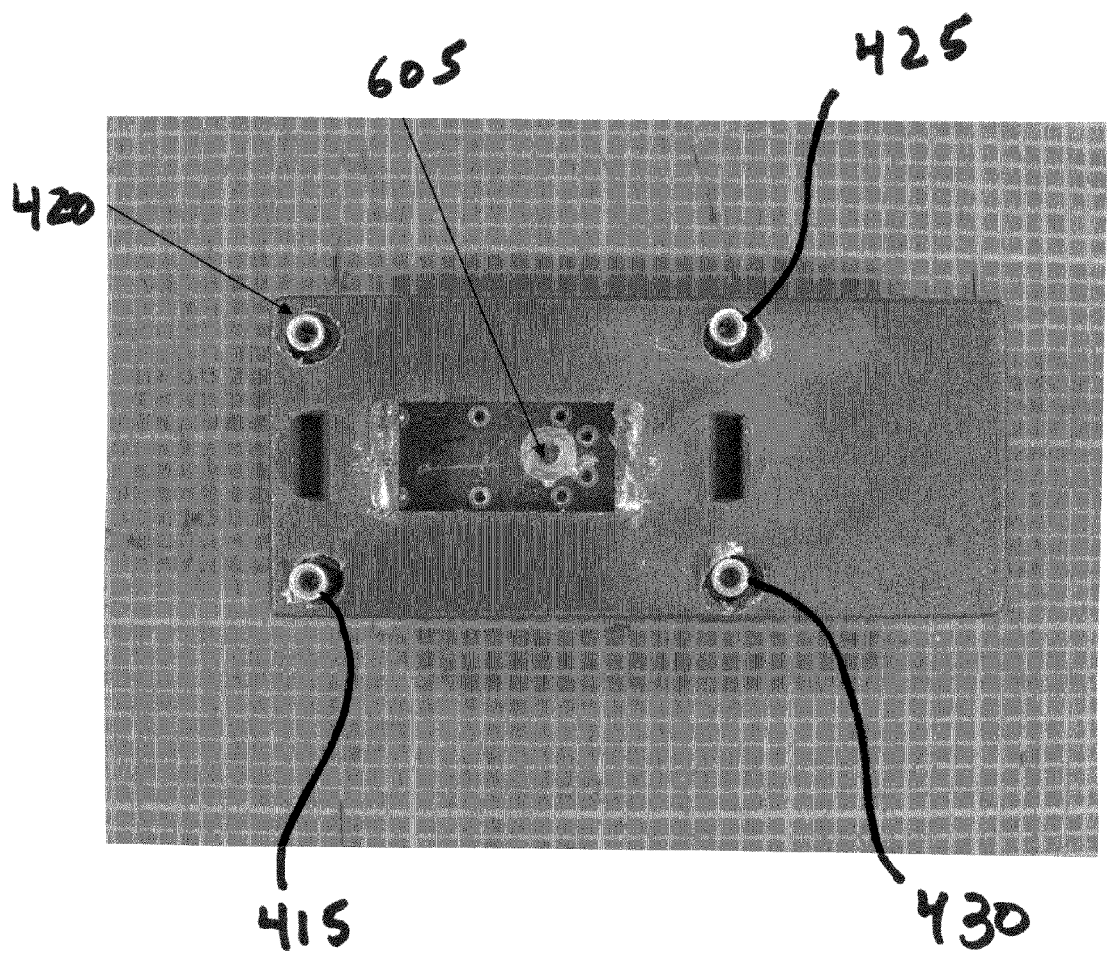
FIG. 10 is a top view of an example mother board similar to that schematically shown in FIG. 7.

FIG. 10 is a top view of an example mother board similar to that schematically shown in FIG. 7. In FIG. 10, sockets 415, 420, 425, and 430 are electrically connected to the corresponding pins 625, 620, 610, and 615 of an equalizer board. The sockets 415, 420, 425, and 430 receive pins on an equalizer board. FIG. 10 shows the probe portion 605 of the spring contact 600 protruding through the motherboard. This is also schematically shown in FIG. 7. The length of the probe portion 605 is selected so that the pins (610, 615, 620, and 625) on the equalizer board contact the sockets (415, 420, 425, and 430) on the motherboard before the spring contact breaks the connection between, for example, the pins 640 and 645 on the mother board. Of course the length of the pins (610, 615, 620, and 625) can be adjusted if desired in addition to changing the length of the probe portion 605.

What is claimed is:

1. A cable communications equalizer device for outputting an equalized cable communications signal, the equalizer device comprising:
   an input for receiving a cable communications signal;
   a plurality of matched circuit components comprising: a variable resistance circuit component having a variable resistive value, and one or more fixed resistors operably connected to the one or more fixed resistors;
   a plurality of connector locations for receiving a repositionable selective jumper, wherein the variable resistive value is based on a selected position of the repositionable selective jumper; and
   an output for outputting the equalized cable communications signal.

2. The equalizer device of claim 1, wherein the cable communications signal has a frequency of between about 54 MHz and about 1000 MHz.

3. The equalizer device of claim 1, wherein the repositionable selective jumper is a manually repositionable selective jumper.

4. The equalizer device of claim 1, wherein the cable communications signal is selected from the group consisting of video signals, cable television signals, digital data signals, digital telephony signals, and combinations thereof.

5. The equalizer device of claim 1, wherein the output is configured to provide an output signal when the selective jumper is removed from the equalizer.

6. A cable television amplifier comprising:
   at least one cable communications equalizer device comprising:
   an input for receiving a cable communications signal;
   a plurality of matched circuit components comprising: a variable resistance circuit component having a variable resistive value, and one or more fixed resistors operably connected to the one or more fixed resistors;
   a plurality of connector locations for receiving a repositionable selective jumper, wherein the variable resistive value is based on a selected position of the repositionable selective jumper; and
   an output for outputting the equalized cable communications signal.

7. The amplifier of claim 6, wherein the cable communications signal has a frequency of between about 54 MHz and about 1000 MHz.

8. The amplifier of claim 6, wherein the repositionable selective jumper is a manually repositionable selective jumper.

9. The amplifier of claim 6, wherein the cable communications signal is selected from the group consisting of video signals, cable television signals, digital data signals, digital telephony signals, and combinations thereof.

10. The amplifier of claim 6, wherein the output is configured to provide an output signal when the selective jumper is removed from the equalizer.

11. A motherboard comprising:
    at least one cable communications equalizer device comprising:
    an input for receiving a cable communications signal;
    a plurality of matched circuit components comprising: a variable resistance circuit component having a variable resistive value, and one or more fixed resistors operably connected to the one or more fixed resistors;
    a plurality of connector locations for receiving a repositionable selective jumper, wherein the variable resistive value is based on a selected position of the repositionable selective jumper; and
    an output for outputting the equalized cable communications signal.

12. The motherboard of claim 11, wherein the cable communications signal has a frequency of between about 54 MHz and about 1000 MHz.

13. The motherboard of claim 11, wherein the repositionable selective jumper is a manually repositionable selective jumper.

14. The motherboard of claim 11, wherein the cable communications signal is selected from the group consisting of video signals, cable television signals, digital data signals, digital telephony signals, and combinations thereof.

15. The motherboard of claim 11, wherein the output is configured to provide an output signal when the selective jumper is removed from the equalizer.

* * * * *